US011277157B2

(12) United States Patent
Takahashi

(10) Patent No.: US 11,277,157 B2
(45) Date of Patent: Mar. 15, 2022

(54) RADIO FREQUENCY MODULE AND COMMUNICATION DEVICE

(71) Applicant: Murata Manufacturing Co., Ltd., Nagaokakyo (JP)

(72) Inventor: Hidetaka Takahashi, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 17/123,121

(22) Filed: Dec. 16, 2020

(65) Prior Publication Data
US 2021/0203367 A1 Jul. 1, 2021

(30) Foreign Application Priority Data
Dec. 26, 2019 (JP) .............................. JP2019-237089

(51) Int. Cl.
H04B 1/04 (2006.01)
H04B 1/00 (2006.01)
(Continued)

(52) U.S. Cl.
CPC ........... H04B 1/0057 (2013.01); H03F 3/195 (2013.01); H03F 3/213 (2013.01); H04B 1/04 (2013.01);
(Continued)

(58) Field of Classification Search
CPC ......... H01L 21/84; H01L 23/60; H01L 24/16; H01L 25/16; H03C 1/62; H03F 1/56;
(Continued)

(56) References Cited
U.S. PATENT DOCUMENTS
2013/0115895 A1 5/2013 Crandall
2016/0099192 A1* 4/2016 Chen ...................... H01L 24/97
361/772
(Continued)

FOREIGN PATENT DOCUMENTS
JP 2018-098677 A 6/2018
KR 2016-0100796 A 8/2016
(Continued)

OTHER PUBLICATIONS
Office Action dated Oct. 27, 2021, in corresponding Korean patent Application No. 10-2020-0170040, 7 pages.

Primary Examiner — Shawkat M Ali
(74) Attorney, Agent, or Firm — Xsensus LLP

(57) ABSTRACT
A radio frequency module includes: a duplexer for a first communication band; a first power amplifier and a first low-noise amplifier connected to the duplexer; a second power amplifier and a second low-noise amplifier for a second communication band; and a switch that switches a connection of an antenna connection terminal between the second power amplifier and the second low-noise amplifier, wherein the first power amplifier and the second power amplifier are disposed on a first principal surface of a module substrate, the first low-noise amplifier and the second low-noise amplifier are incorporated in a semiconductor IC disposed on a second principal surface of the module substrate, and in a plan view of the module substrate, the distance between the first power amplifier and the semiconductor IC is greater than the distance between the second power amplifier and the semiconductor IC.

19 Claims, 6 Drawing Sheets

(51) Int. Cl.
  *H03F 3/213* (2006.01)
  *H03F 3/195* (2006.01)
(52) U.S. Cl.
  CPC .................. *H03F 2200/451* (2013.01); *H04B 2001/0408* (2013.01)
(58) Field of Classification Search
  CPC ..... H03F 3/19; H03F 3/21; H03F 3/24; H03F 3/195; H03F 3/213; H03F 2200/267; H03F 2200/294; H03F 2200/451; H04B 1/00; H04B 1/04; H04B 1/16; H04B 1/28; H04B 1/38; H04B 1/44; H04B 1/48; H04B 1/0053; H04B 1/0057; H04B 1/0475; H04B 17/00; H04B 200/0408; H04M 1/02; H04M 1/0277
  USPC ......... 333/129, 132–133; 375/262, 295–297; 455/82, 115.1, 127.1, 323, 333, 522
  See application file for complete search history.

(56) References Cited

U.S. PATENT DOCUMENTS

| | | |
|---|---|---|
| 2016/0241196 A1 | 8/2016 | Lehtola |
| 2018/0166387 A1 | 6/2018 | Matsui et al. |
| 2019/0273314 A1* | 9/2019 | Wloczysiak ............ H04B 1/525 |

FOREIGN PATENT DOCUMENTS

| | | |
|---|---|---|
| KR | 10-2052307 B1 | 12/2019 |
| WO | 2017/006866 A1 | 1/2017 |

* cited by examiner

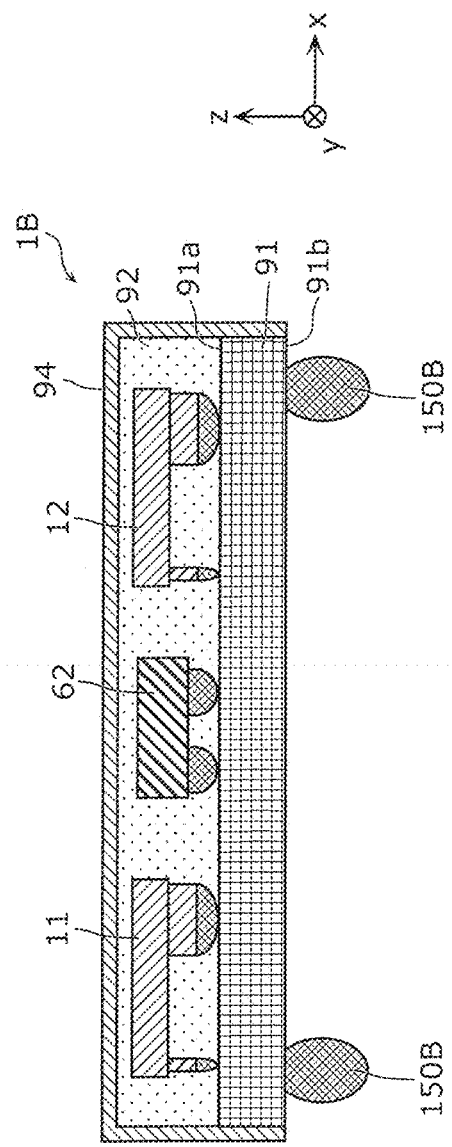

RADIO FREQUENCY MODULE AND COMMUNICATION DEVICE

CROSS REFERENCE TO RELATED APPLICATION

The present application is based on and claims priority to Japanese Patent Application No. 2019-237089 filed on Dec. 26, 2019. The entire disclosure of the above-identified application, including the specification, drawings and claims is incorporated herein by reference in its entirety.

TECHNICAL FIELD

The present disclosure relates to a radio frequency module and a communication device.

BACKGROUND

In a mobile communication device such as a mobile phone, the disposition and structure of circuit components of a radio frequency front-end circuit are increasingly more complex with the progress particularly in multiband communications.

WO2017/006866 discloses that a front-end module may include not only a frequency division duplex (FDD) signal path, but also a time division duplex (TDD) signal path. Stated differently, WO2017/006866 suggests a system that enables the use of both a communication band in which transmission and reception are concurrently performed and a communication band in which transmission and reception are performed in different time slots.

SUMMARY

Technical Problems

However, as recognized by the present inventor, WO2017/006866 fails to disclose how the circuit components of the front-end module should be disposed in the system that enables the use of both the communication band in which transmission and reception are concurrently performed and the communication band in which transmission and reception are performed in different time slots. As such, there is a concern about the degradation in the isolation characteristics between a transmission circuit and a reception circuit particularly in a dual-sided, surface-mount module.

In view of the above, the present disclosure aims to provide a dual-sided, surface-mount radio frequency module and a communication device capable of improving the isolation characteristics between a transmission circuit and a reception circuit in a system that enables the use of both a communication band in which transmission and reception are concurrently performed and a communication band in which transmission and reception are performed in different time slots.

Solutions

A radio frequency module according to an aspect of the present disclosure includes: a substrate including a first principal surface and a second principal surface on opposite sides of the substrate; a duplexer including a first filter having a passband that includes a transmission band in a first communication band and a second filter having a passband that includes a reception band in the first communication band; a first power amplifier disposed on the first principal surface and connected to the first filter and configured to amplify a transmission signal in the first communication band; a first low-noise amplifier connected to the second filter and configured to amplify a reception signal in the first communication band; a second power amplifier disposed on the first principal surface and configured to amplify a transmission signal in a second communication band that is different from the first communication band; a second low-noise amplifier configured to amplify a reception signal in the second communication band; a switch configured to switch a connection of an antenna connection terminal between the second power amplifier and the second low-noise amplifier, wherein the first low-noise amplifier and the second low-noise amplifier are incorporated in a semiconductor integrated circuit that is disposed on the second principal surface, and in a plan view of the substrate, a distance between the first power amplifier and the semiconductor integrated circuit is greater than a distance between the second power amplifier and the semiconductor integrated circuit.

Advantageous Effects

The radio frequency module according to an aspect of the present disclosure is capable of improving the isolation characteristics between a transmission circuit and a reception circuit in a system that enables the use of both a communication band in which transmission and reception are concurrently performed and a communication band in which transmission and reception are performed in different time slots.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 6 is a cross-sectional view of a radio frequency module according to Variation 2.

DESCRIPTION OF EMBODIMENT

Figure 1:
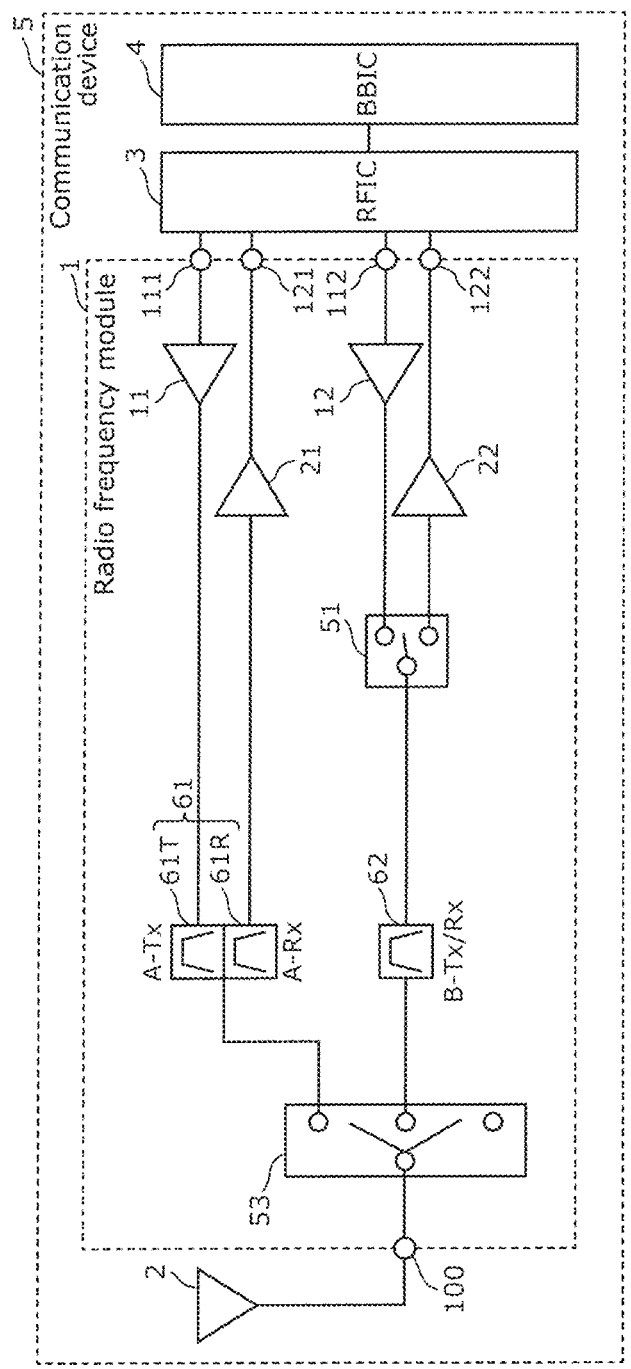
FIG. 1 is a diagram showing the circuit structures of a radio frequency module and a communication device according to an embodiment of the present disclosure.

The following describes in detail the embodiment and variations thereof according to the present disclosure with reference to the drawings. Note that the following embodiment and variations thereof show a comprehensive or specific example of the present disclosure. The numerical values, shapes, materials, structural elements, the arrangement and connection of the structural elements, etc. shown in the following embodiment and variations thereof are mere examples, and thus are not intended to limit the present disclosure.

Note that the drawings are schematic diagrams in which emphasis, omission, or ratio adjustment has been applied where necessary to illustrate the present disclosure. The drawings are thus not necessarily exact illustration of the present disclosure, and may illustrate shapes, positional relationships, and ratios differently from the actual ones. In the drawings, substantially the same structural elements are assigned the same reference marks, and their repetitive description may be omitted or simplified.

In the drawings, the X axis and the Y axis are orthogonal to each other on a plane that is parallel to a principal surface of a module substrate. Also, the Z axis is normal to a principal surface of the module substrate. The positive direction and the negative direction of the Z axis indicate the upward direction and the downward direction, respectively.

Also, terms used in the present disclosure have the meanings described below.

"connected" means not only the case where elements are directly connected via a connection terminal and/or a wiring conductor, but also the case where elements are electrically connected via another circuit element.

terms that represent the relation between elements (e.g., "parallel" and "vertical"), terms that represent the shape of an element (e.g., "rectangular"), and a range of numerical values indicate not only the exact meanings of the terms, but also substantially equivalent scopes of the terms. For example, such terms include the meaning of a few percent of error.

"in a plan view of a substrate" means a view of an object that is orthographically projected onto the XY plane and seen from the positive direction of the Z axis.

"C is located between A and B in a plan view of a substrate" means that, in a plan view of the substrate, a line that connects a point in A and a point in B passes through C.

EMBODIMENT

Figure 2:
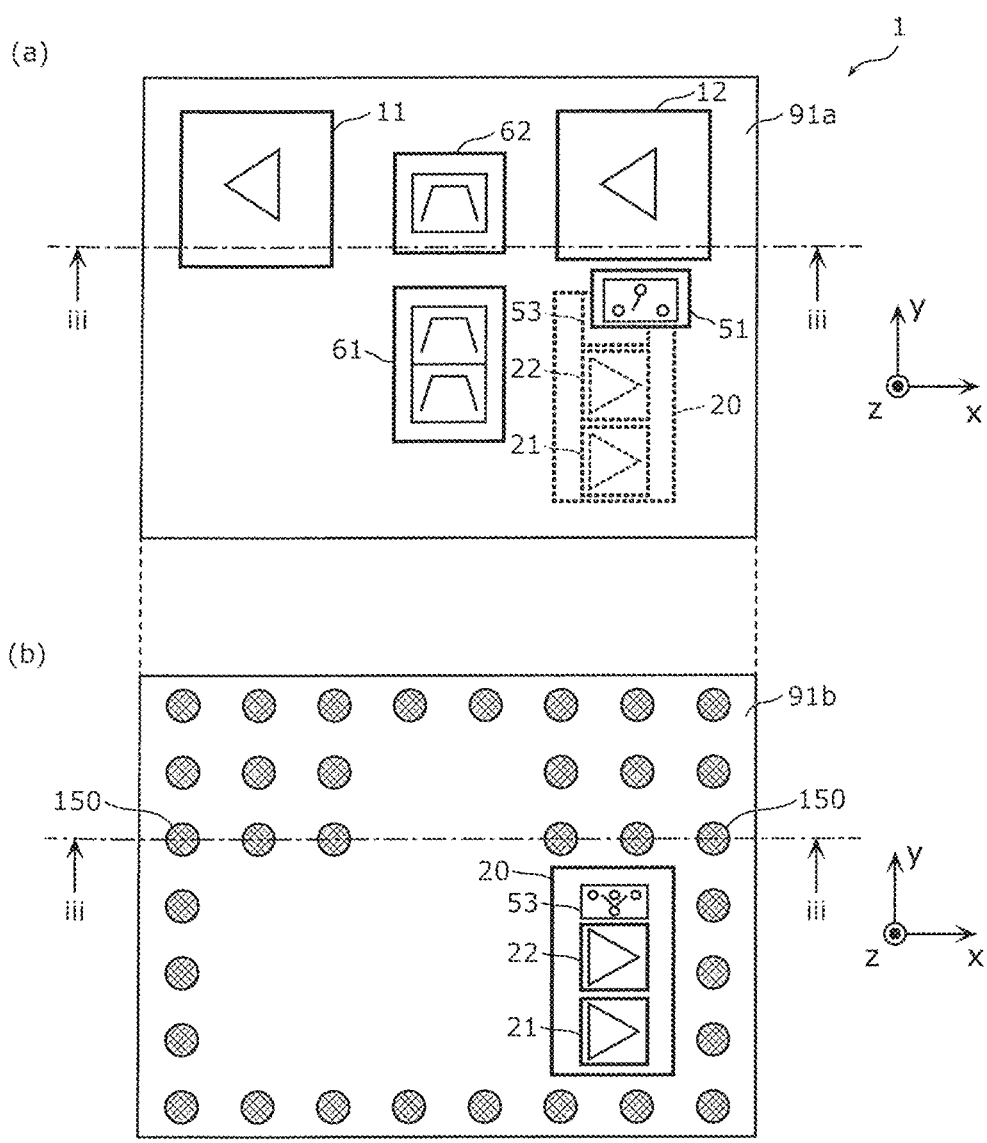
FIG. 2 is a plan view of the radio frequency module according to the embodiment.
Figure 3:
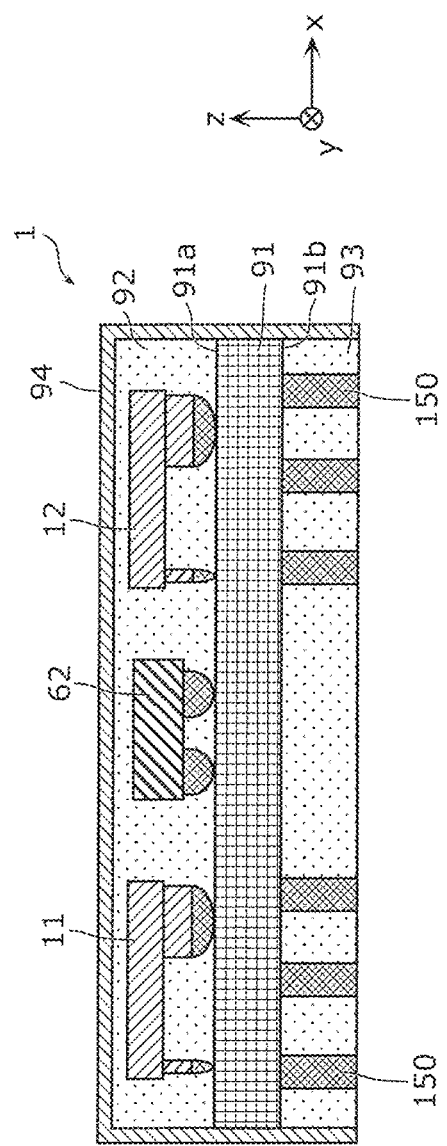
FIG. 3 is a cross-sectional view of the radio frequency module according to the embodiment.

With reference to FIG. 1 through FIG. 3, the embodiment will be described below.

[1.1 Circuit Structures of Radio Frequency Module 1 and Communication Device 5]

The following describes the circuit structures of radio frequency module 1 and communication device 5 according to the present embodiment. FIG. 1 is a diagram showing the circuit structures of radio frequency module 1 and communication device 5 according to the present embodiment.

[1.1.1 Circuit Structure of Communication Device 5]

With reference to FIG. 1, the circuit structure of communication device 5 will be specifically described. As shown in FIG. 1, communication device 5 includes radio frequency module 1, antenna 2, RFIC 3, and BBIC 4.

Radio frequency module 1 transfers a radio frequency signal between antenna 2 and RFIC 3. A detailed circuit structure of radio frequency module 1 will be described later.

Antenna 2 is connected to antenna connection terminal 100 of radio frequency module 1. Antenna 2 radiates a radio frequency signal outputted from radio frequency module 1. Antenna 2 also receives a radio frequency signal from outside and outputs the received radio frequency signal to radio frequency module 1.

RFIC 3 is an example of the signal processing circuit that processes a radio frequency signal that is to be transmitted or has been received by antenna 2. More specifically, RFIC 3 performs signal processing, such as down-conversion, on a radio frequency reception signal inputted via a reception signal path of radio frequency module 1, and outputs the resulting reception signal to BBIC 4. RFIC 3 also performs signal processing, such as up-conversion, on a transmission signal inputted from BBIC 4, and outputs the resulting radio frequency transmission signal to a transmission signal path of radio frequency module 1.

BBIC 4 is a baseband signal processing circuit that performs signal processing by use of an intermediate frequency band, the frequency of which is lower than that of a radio frequency signal transferred by radio frequency module 1. The signal processed by BBIC 4 is used, for example, as an image signal for image display, or as a sound signal for telephone conversation through a speaker.

RFIC 3 controls connections of switches 51 and 53 included in radio frequency module 1 on the basis of a communication band to be used. RFIC 3 also transfers, to radio frequency module 1, a control signal for adjusting the gain, etc. of power amplifier 11 of radio frequency module 1.

Note that communication device 5 according to the present embodiment may not include antenna 2 and BBIC 4. Stated differently, antenna 2 and BBIC 4 are not essential structural elements of the communication device according to the present disclosure.

[1.1.2 Circuit Structure of Radio Frequency Module 1]

With reference to FIG. 1, the circuit structure of radio frequency module 1 will be specifically described. As shown in FIG. 1, radio frequency module 1 includes power amplifiers 11 and 12, low-noise amplifiers 21 and 22, switches 51 and 53, duplexer 61, filter 62, antenna connection terminal 100, transmission input terminals 111 and 112, and reception output terminals 121 and 122.

Power amplifier 11, which is an example of the first power amplifier, amplifies a radio frequency transmission signal inputted from transmission input terminal 111. More specifically, power amplifier 11 is connected to transmission filter 61T and amplifies a transmission signal in communication band A.

Power amplifier 12, which is an example of the second power amplifier, amplifies a radio frequency transmission signal inputted from transmission input terminal 112. More specifically, power amplifier 12 is connected to filter 62 via switch 51 and amplifies a transmission signal in communication band B.

In the present embodiment, communication band A, which is an example of the first communication band, is a communication band to which FDD is applied as its duplex mode. Communication band B, which is an example of the second communication band, is a communication band to which TDD is applied as its duplex mode. More specifically, examples of communication band A to be used include the following long term evolution (LTE) bands: Band 1 (transmission frequencies of 1920 to 1980 MHz, reception frequencies of 2110 to 2170 MHz); and Band 3 (transmission frequencies of 1710 to 1785 MHz, reception frequencies of 1805 to 1880 MHz). Examples of communication band B to be used include the following LTE bands: Band 39 (1880 to 1920 MHz); Band 40 (2300-2400 MHz); and Band 41 (2496-2690 MHz). Note that communication bands A and B are not limited to these communication bands, and thus may be communication bands having different frequencies, or may be communication bands of another communication system (e.g., the fifth-generation mobile communication system or a wireless LAN system).

Low-noise amplifier 21, which is an example of the first low-noise amplifier, amplifies the radio frequency reception signal and outputs the resulting radio frequency reception signal to reception output terminal 121. More specifically, low-noise amplifier 21 is connected to reception filter 61R and performs low-noise amplification on a reception signal in communication band A that has passed reception filter 61R.

Low-noise amplifier 22, which is an example of the second low-noise amplifier, amplifies the radio frequency reception signal and outputs the resulting radio frequency reception signal to reception output terminal 122. More specifically, low-noise amplifier 22 is connected to filter 62 via switch 51 and performs low-noise amplification on a reception signal in communication band B that has passed filter 62.

Duplexer 61 passes radio frequency signals in communication band A. More specifically, duplexer 61 transfers a transmission signal and a reception signal in communication band A by the FDD method. Stated differently, duplexer 61 is a circuit element for concurrently transferring a transmission signal and a reception signal in communication band A. Duplexer 61 includes transmission filter 61T and reception filter 61R.

Transmission filter 61T is an example of the first filter having a passband that includes the transmission band in the first communication band. Transmission filter 61T has the transmission band in communication band A as its passband. Transmission filter 61T is connected between power amplifier 11 and antenna connection terminal 100 and selectively passes a transmission signal in communication band A which has been amplified by power amplifier 11.

Reception filter 61R is an example of the second filter having a passband that includes the reception band in the first communication band. Reception filter 61R has the reception band in communication band A as its passband. Reception filter 61R is connected between low-noise amplifier 21 and antenna connection terminal 100 and selectively passes a reception signal in communication band A.

Filter 62 is an example of the third filter having a passband that includes the second communication band. Filter 62 has communication band B as its passband. Filter 62 transfers a transmission signal and a reception signal in communication band B by the TDD method. Filter 62 is connected between antenna connection terminal 100 and power amplifier 12 and between antenna connection terminal 100 and low-noise amplifier 22. More specifically, filter 62 is connected between switch 51 and switch 53.

Switch 51 is connected between filter 62 and power amplifier 12 and between filter 62 and low-noise amplifier 22, and is connected to antenna connection terminal 100 via filter 62 and switch 53. More specifically, switch 51 includes a common terminal and two selection terminals. The common terminal of switch 51 is connected to filter 62. A first selection terminal, which is one of the two selection terminals of switch 51, is connected to power amplifier 12, and a second selection terminal, which is the other of the two selection terminals of switch 51, is connected to low-noise amplifier 22.

Having such connection structure, switch 51 switches between connecting the common terminal and the first selection terminal, and connecting the common terminal and the second selection terminal. Stated differently, switch 51 is a TDD switch that exclusively switches between connecting antenna connection terminal 100 and power amplifier 12, and connecting antenna connection terminal 100 and low-noise amplifier 22. In other words, switch 51 is a circuit element for transferring a transmission signal and a reception signal in communication band B in different time slots. Switch 51 is implemented, for example, as a single pole double throw (SPDT) switch circuit.

Switch 53 is connected between antenna connection terminal 100 and duplexer 61 and between antenna connection terminal 100 and filter 62. More specifically, switch 53 includes a common terminal and at least two selection terminals. The common terminal of switch 53 is connected to antenna connection terminal 100. A first selection terminal, which is one of the at least two selection terminals of switch 53, is connected to duplexer 61, and a second selection terminal, which is another one of the at least two selection terminals of switch 53, is connected to filter 62.

Having such connection structure, switch 53 switches between connecting/disconnecting the common terminal and the first selection terminal, and connecting/disconnecting the common terminal and the second selection terminal. Stated differently, switch 53 is an antenna switch that switches between connecting/disconnecting antenna connection terminal 100 and duplexer 61, and connecting/disconnecting antenna connection terminal 100 and filter 62. Switch 53 is implemented, for example, as a multi-connection switch circuit.

Note that radio frequency module 1 may not include one or more of the circuit elements shown in FIG. 1. Radio frequency module 1 is simply required to include, for example, duplexer 61, power amplifiers 11 and 12, low-noise amplifiers 21 and 22, and switch 53, without needing to include other circuit elements.

[1.2 Disposition of Circuit Components of Radio Frequency Module 1]

With reference to FIG. 2 and FIG. 3, the following specifically describes the disposition of the circuit components of radio frequency module 1 with the above structure.

FIG. 2 is a plan view of radio frequency module 1 according to the embodiment. In FIG. 2, (a) is a view of principal surface 91*a* of module substrate 91 seen from the positive direction of the Z axis, and (b) is a perspective view of principal surface 91*b* of module substrate 91 seen from the positive direction of the Z axis. In (a), circuit components disposed on principal surface 91*b* are indicated by dashed lines. FIG. 3 is a cross-sectional view of radio frequency module 1 according to the embodiment. FIG. 3 shows a cross-section of radio frequency module 1 cult along iii-iii line shown in FIG. 2.

As shown in FIG. 2 and FIG. 3, in addition to the circuit components that incorporate the circuit elements shown in FIG. 1, radio frequency module 1 further includes: semiconductor integrated circuit (IC) 20 that incorporates low-noise amplifiers 21 and 22, and switch 53; module substrate 91; resin members 92 and 93; shield electrode layer 94; and a plurality of post electrodes 150. Note that FIG. 2 omits the illustration of resin members 92 and 93 to illustrate the circuit components.

Module substrate 91 includes principal surface 91*a* and principal surface 91*b* on opposite sides of module substrate 91. Module substrate 91 according to the present embodiment has a rectangular shape in a plan view of module substrate 91. Non-limiting examples of module substrate 91 to be used include a printed circuit board (PCB), a low temperature co-fired ceramics (LTCC) substrate, and a multilayered resin substrate.

Principal surface 91*a*, which is an example of the first principal surface, is also referred to as an upper surface or a surface. As shown in (a) in FIG. 2, mounted on principal surface 91*a* are power amplifiers 11 and 12, switch 51, duplexer 61, and filter 62.

Principal surface 91*b*, which is an example of the second principal surface, is also referred to as a lower surface or a back surface. As shown in (b) in FIG. 2, mounted on principal surface 91b are: semiconductor IC 20 that incorporate low-noise amplifiers 21 and 22, and switch 53; and a plurality of post electrodes 150.

Duplexer 61 is an example of the second conductive component. As shown in (a) in FIG. 2, duplexer 61 is disposed between power amplifier 11 and semiconductor IC 20 in a plan view of module substrate 91.

A conductive component is an electrical component, such as a signal extraction electrode, that includes a conductive material. The conductive component includes, for example, at least one of an active device (e.g., chip resistance, chip capacitor, chip inductor, filter, and switch) or a passive device (e.g., amplifier and control circuit).

Filter 62 is an example of the first conductive component. As shown in (a) in FIG. 2, filter 62 is disposed between power amplifiers 11 and 12 in a plan view of module substrate 91.

Non-limiting examples of duplexer 61 and filter 62 include an acoustic wave filter utilizing surface acoustic wave (SAW), an acoustic wave filter utilizing bulk acoustic wave (BAW), an LC resonant filter, and a dielectric filter, or may be any combination of these filters.

Switch 51 is an example of the third conductive component. As shown in (a) in FIG. 2, switch 51 is disposed between power amplifier 12 and semiconductor IC 20 in a plan view of module substrate 91.

Semiconductor IC 20 has, for example, a complementary metal oxide semiconductor (CMOS) structure. More specifically, semiconductor IC 20 is fabricated by a silicon on insulator (SOI) process. This enables a low-cost manufacture of semiconductor IC 20. Note that semiconductor IC 20 may include at least one of GaAs, SiGe, or GaN. This enables the output of a radio frequency signal having high quality amplification properties and noise characteristics. Note that semiconductor IC 20 may further incorporate switch 51.

As shown in (a) in FIG. 2, in a plan view of module substrate 91, power amplifier 11 and semiconductor IC 20 are disposed at opposing corners of module substrate 91 in a rectangular shape. Power amplifier 12 and semiconductor IC 20 are disposed at neighboring corners of module substrate 91. This disposition enables the distance between power amplifier 11 and semiconductor IC 20 to be greater than the distance between power amplifier 12 and semiconductor IC 20 in a plan view of module substrate 91.

Note that the distance between two objects in a plan view of module substrate 91 means the shortest distance between the outer edges of the two objects that are orthographically projected onto the XY plane. Stated differently, the distance between the two objects is the length of the shortest line among a plurality of lines that connect the outer edge of one of the objects and the outer edge of the other of the objects on the XY plane.

In semiconductor IC 20, low-noise amplifier 21 is disposed at the most distant position from power amplifiers 11 and 12, and switch 53 is disposed between low-noise amplifier 21 and power amplifier 12.

A plurality of post electrodes 150 is an example of the external-connection terminals. Each of post electrodes 150 is disposed on and extends vertically from principal surface 91b of module substrate 91. Also, each of post electrodes 150 penetrates resin member 93, and one of its ends is exposed from resin member 93. The ends of post electrodes 150 being exposed from resin member 93 are connected to an input and output terminal and/or a ground electrode, and so forth on the mother board that is disposed in the negative direction of the Z axis of radio frequency module 1.

Resin member 92 is disposed on principal surface 91a of module substrate 91, and covers the circuit components on principal surface 91a. Resin member 93 is disposed on principal surface 91b of module substrate 91, and covers the circuit components on principal surface 91b. Resin members 92 and 93 are capable of ensuring the reliability of the circuit components disposed on principal surfaces 91a and 91b, such as their mechanical strength and humidity resistance.

Shield electrode layer 94 covers the upper and side surfaces of resin member 92, the side surfaces of module substrate 91, and the side surfaces of resin member 93. Set at the ground potential, shield electrode layer 94 prevents the entry of exogenous noise into the circuit components included in radio frequency module 1.

Note that radio frequency module 1 may not include resin members 92 and 93, and shield electrode layer 94. Stated differently, resin members 92 and 93, and shield electrode layer 94 are not essential structural elements of the radio frequency module according to the present disclosure.

[1.3 Effect, Etc.]

As described above, radio frequency module 1 according to the present embodiment includes: duplexer 61 including transmission filter 61T having a passband that includes the transmission band in communication band A and reception filter 61R having a passband that includes the reception band in communication band A; power amplifier 11 that is connected to transmission filter 61T and amplifies a transmission signal in communication band A; low-noise amplifier 21 that is connected to reception filter 61R and amplifies a reception signal in communication band A; power amplifier 12 that amplifies a transmission signal in communication band B that is different from communication band A; low-noise amplifier 22 that amplifies a reception signal in communication band B; switch 51 that switches a connection of antenna connection terminal 100 between power amplifier 12 and low-noise amplifier 22; and module substrate 91 including principal surface 91a and principal surface 91b on opposite sides of module substrate 91. In such radio frequency module 1, power amplifiers 11 and 12 are disposed on principal surface 91a, low-noise amplifiers 21 and 22 are incorporated in semiconductor IC disposed on principal surface 91b, and in a plan view of module substrate 91, the distance between power amplifier 11 and semiconductor IC 20 is greater than the distance between power amplifier 12 and semiconductor IC 20.

Also, communication device 5 according to the present embodiment includes: RFIC 3 that processes a radio frequency signal that is to be transmitted or has been received by antenna 2; and radio frequency module 1 that transfers the radio frequency signal between antenna 2 and RFIC 3.

This structure enables the distance between power amplifier 11 that is connected to duplexer 61 and semiconductor IC 20 that incorporates low-noise amplifiers 21 and 22 to be greater than the distance between power amplifier 12 that is connected to switch 51 and semiconductor IC 20 in a plan view of module substrate 91. This enables power amplifier 11 and low-noise amplifier 21 for FDD, which concurrently operate, to be disposed spaced more apart from each other in a horizontal direction than power amplifier 12 and low-noise amplifier 22 for TDD, which do not concurrently operate. This further enables power amplifier 11 and semiconductor IC 20 to be disposed on different principal surfaces of module substrate 91. This thus enables power amplifier 11 and low-noise amplifier 21 for FDD, which concurrently operate, to be disposed spaced apart from each other also in a vertical direction. This consequently prevents magnetic field coupling, electric field coupling, or electromagnetic field coupling between power amplifier 11 and low-noise amplifier 21 for FDD, thus improving the isolation characteristics between the transmission circuit and the reception circuit. Further, by disposing the circuit components on both surfaces of module substrate 91, the downsizing of module substrate 1 is also achieved.

Also, radio frequency module 1 according to the present embodiment may further include, for example, a first conductive component that is disposed on principal surface 91a, between power amplifiers 11 and 12 in a plan view of module substrate 91.

This structure enables the first conductive component to be disposed between power amplifiers 11 and 12. In this structure, the first conductive component prevents magnetic field coupling, electric field coupling, or electromagnetic field coupling between power amplifiers 11 and 12, thus preventing mutual interference between a transmission signal in communication band A and a transmission signal in communication band B.

Also, radio frequency module 1 according to the present embodiment may further include, for example, filter 62 having a passband that includes communication band B. In such radio frequency module 1, switch 51 may be connected to antenna connection terminal 100 via filter 62, and the first conductive component may include filter 62.

This structure enables filter 62 to be used as the first conductive component in the case where filter 62 is used for a transmission signal and a reception signal of TDD in communication band B. This structure thus reduces the number of components of radio frequency module 1 compared to the case where a dedicated component is used as the first conductive component.

Also, radio frequency module 1 according to the present embodiment may further include, for example, a second conductive component that is disposed on principal surface 91a, between power amplifier 11 and semiconductor IC 20 in a plan view of module substrate 91.

This enables the second conductive component to be disposed between power amplifier 11 and semiconductor IC 20. In this structure, the second conductive component prevents magnetic field coupling, electric field coupling, or electromagnetic field coupling between power amplifier 11 and low-noise amplifier 21 for FDD, thus further improving the isolation characteristics between the transmission circuit and the reception circuit.

Also, in radio frequency module 1 according to the present embodiment, the second conductive component may further include, for example, duplexer 61.

This structure enables duplexer 61 to be used as the second conductive component. This structure thus reduces the number of components of radio frequency module 1 compared to the case where a dedicated component is used as the second conductive component.

Also, radio frequency module 1 according to the present embodiment may further include, for example, a third conductive component that is disposed on principal surface 91a or principal surface 91b, between power amplifier 12 and semiconductor IC 20 in a plan view of module substrate 91.

This enables the third conductive component to be disposed between power amplifier 12 and semiconductor IC 20. In this structure, the third conductive component prevents magnetic field coupling, electric field coupling, or electromagnetic field coupling between power amplifier 12 and low-noise amplifier 21, which can concurrently operate, thus further improving the isolation characteristics between the transmission circuit and the reception circuit.

Also, in radio frequency module 1 according to the present embodiment, the third conductive component may further include, for example, switch 51.

This structure enables switch 51 to be used as the third conductive component. This structure thus reduces the number of components of radio frequency module 1 compared to the case where a dedicated component is used as the third conductive component.

Also, radio frequency module 1 according to the present embodiment may further include, for example, external-connection terminals (post electrodes 150) disposed on principal surface 91b.

This structure enables the external-connection terminals to be disposed not on principal surface 91a on which power amplifiers 11 and 12 are disposed, but on principal surface 91b on which semiconductor IC 20 is disposed. This structure thus improves the heat radiation of power amplifiers 11 and 12 compared to the case where power amplifiers 11 and 12 are disposed on principal surface 91b on which the external-connection terminals are disposed. This further enables semiconductor IC 20, which is relatively low in height, to be disposed on principal surface 91b on which the external-connection terminals are disposed, thus reducing the height of the external-connection terminals and contributing to the reduction in the height of radio frequency module 1.

Also, in radio frequency module 1 according to the present embodiment, for example, communication band A is a communication band to which FDD is applied as a duplex mode, and communication band B is a communication band to which TDD is applied as a duplex mode.

This structure improves the isolation characteristics between the transmission circuit and the reception circuit in a system that enables the use of both FDD and TDD.

Variation 1

The following describes Variation 1 of the embodiment. The present variation is different from the embodiment mainly in the circuit structure for TDD. With reference to the drawings, the following description focuses on the difference from the embodiment to describe the present variation.

[2.1 Circuit Structures of Radio Frequency Module 1A and Communication Device 5A]

Figure 4:
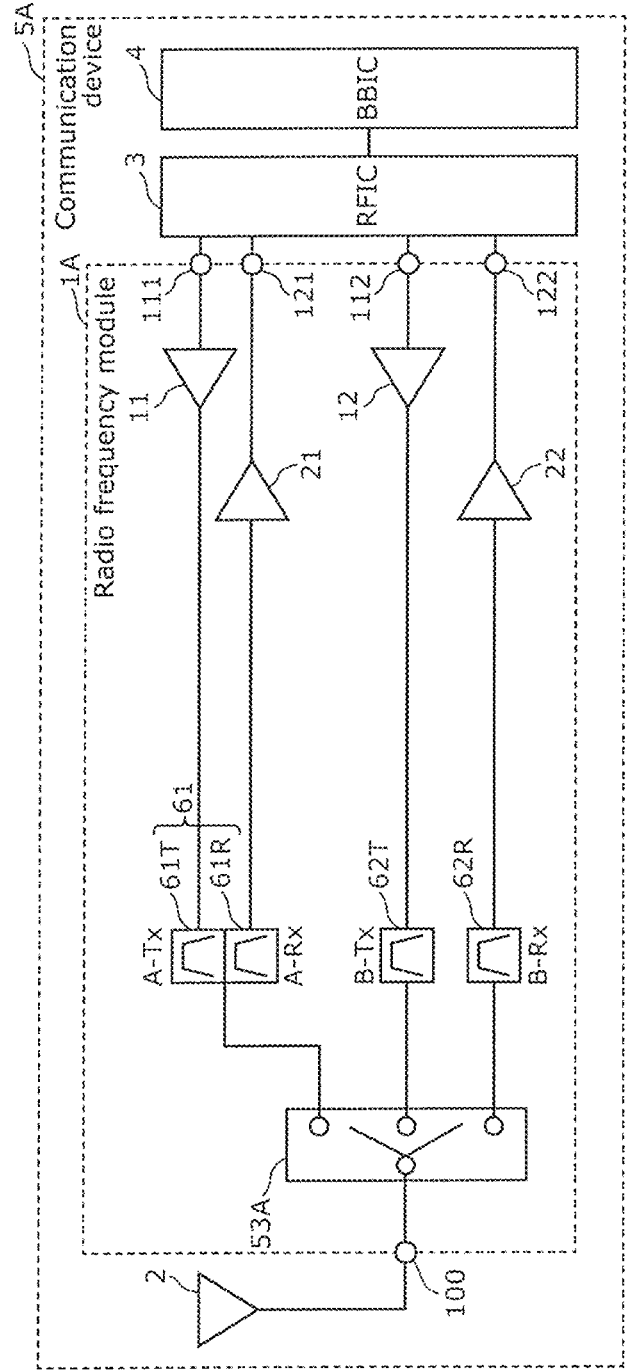
FIG. 4 is a diagram showing the circuit structures of a radio frequency module and a communication device according to Variation 1.

FIG. 4 is a diagram showing the circuit structures of radio frequency module 1A and communication device 5A according to Variation 1. As shown in FIG. 4, communication device 5A according to the present variation includes radio frequency module 1A, antenna 2, RFIC 3, and BBIC 4. Radio frequency module 1A includes power amplifiers 11 and 12, low-noise amplifiers 21 and 22, switch 53A, duplexer 61, transmission filter 62T, reception filter 62R, antenna connection terminal 100, transmission input terminals 111 and 112, and reception output terminals 121 and 122.

Transmission filter 62T is an example of the fourth filter having a passband that includes the transmission band in the second communication band. Transmission filter 62T has the transmission band in communication band B as its passband. Transmission filter 62T is connected between power amplifier 12 and antenna connection terminal 100 and selectively passes a transmission signal in communication band B.

Reception filter 62R is an example of the fifth filter having a passband that includes the reception band in the second communication band. Reception filter 62R has the reception band in communication band B as its passband. Reception filter 62R is connected between low-noise amplifier 22 and antenna connection terminal 100 and selectively passes a reception signal in communication band B.

Switch 53A is connected between antenna connection terminal 100 and duplexer 61, between antenna connection terminal 100 and transmission filter 62T, and between antenna connection terminal 100 and reception filter 62R. More specifically, switch 53A Includes a common terminal and at least three selection terminals. The common terminal of switch 53A is connected to antenna connection terminal 100. A first selection terminal, which is one of the at least three selection terminals of switch 53A, is connected to duplexer 61. A second selection terminal, which is another one of the at least three selection terminals of switch 53A, is connected to transmission filter 62T. A third selection terminal, which is another one of the at least three selection terminals of switch 53A, is connected to reception filter 62R.

Having such connection structure, switch 53A switches between connecting/disconnecting the common terminal and the first selection terminal, connecting/disconnecting the common terminal and the second selection terminal, and connecting/disconnecting the common terminal and the third selection terminal. Stated differently, switch 53A is an antenna switch that switches between connecting/disconnecting antenna connection terminal 100 and duplexer 61, connecting/disconnecting antenna connection terminal 100 and transmission filter 62T, and connecting/disconnecting antenna connection terminal 100 and reception filter 62R. Switch 53A is also a TDD switch that exclusively switches a connection of antenna connection terminal 100 between power amplifier 12 and low-noise amplifier 22. Switch 53A is implemented, for example, as a multi-connection switch circuit.

[2.2 Disposition of Circuit Components of Radio Frequency Module 1A]

Figure 5:
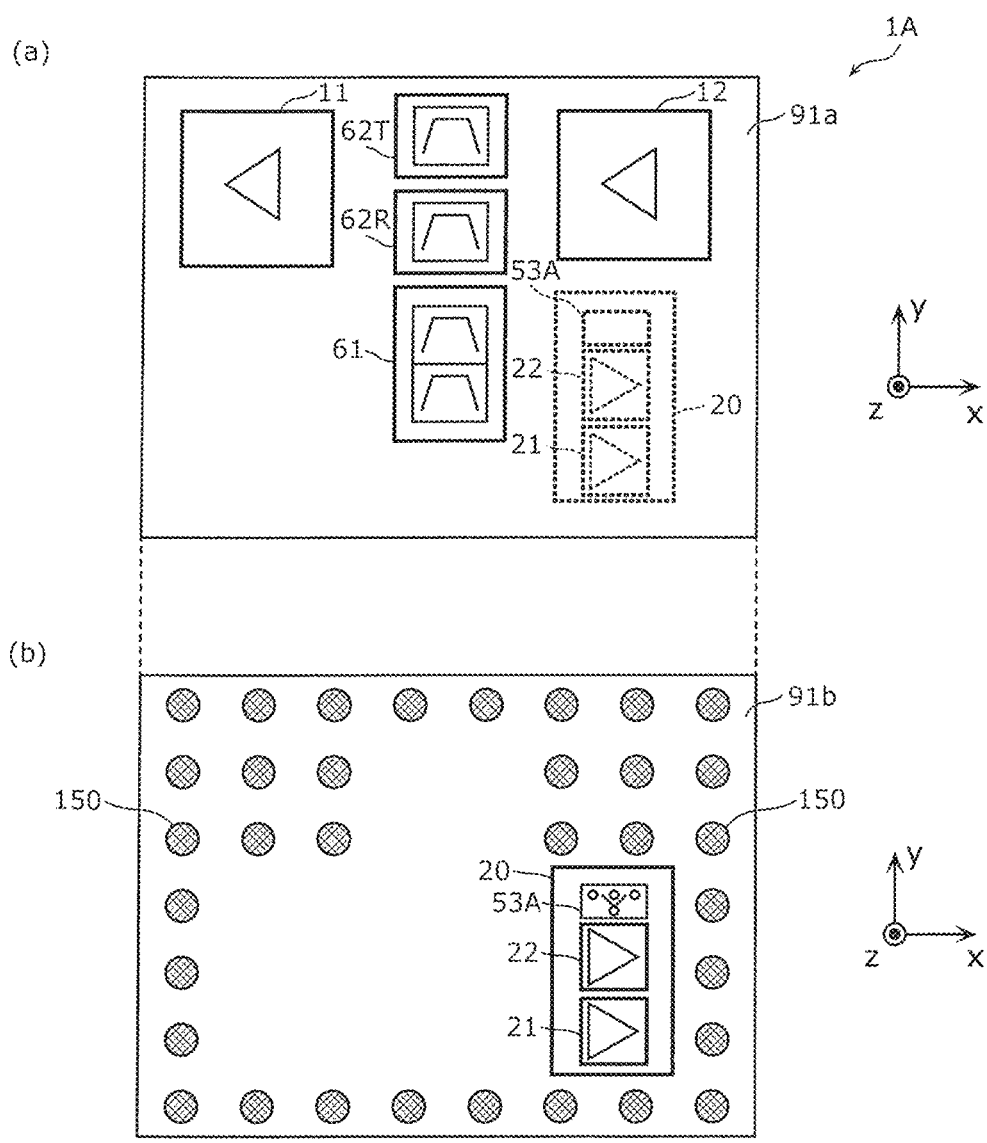
FIG. 5 is a plan view of the radio frequency module according to Variation 1.

With reference to FIG. 5, the following specifically describes the disposition of circuit components of radio frequency module 1A with the above structure.

FIG. 5 is a plan view of radio frequency module 1A according to Variation 1. In FIG. 5, (a) is a view of principal surface 91a of module substrate 91 seen from the positive direction of the Z axis, and (b) is a perspective view of principal surface 91b of module substrate 91 seen from the positive direction of the Z axis. In (a), circuit components disposed on principal surface 91b are indicated by dashed lines.

In the present variation, as shown in FIG. 5, transmission filter 62T and reception filter 62R are an example of the first conductive component. As shown in (a) in FIG. 5, transmission filter 62T and reception filter 62R are disposed on principal surface 91a, between power amplifiers 11 and 12 in a plan view of module substrate 91.

Non-limiting examples of transmission filter 62T and reception filter 62R include an acoustic wave filter utilizing SAW, an acoustic wave filter utilizing BAW, an LC resonant filter, and a dielectric filter, or may be any combination of these filters.

Switch 53A is disposed on principal surface 91b, and is incorporated in semiconductor IC 20 as with switch 53.

[2.3 Effect, Etc.]

As described above, as with the above embodiment, radio frequency module 1A according to the present variation includes: duplexer 61 including transmission filter 61T having a passband that includes the transmission band in communication band A and reception filter 61R having a passband that includes the reception band in communication band A; power amplifier 11 that is connected to transmission filter 61T and amplifies a transmission signal in communication band A; low-noise amplifier 21 that is connected to reception filter 61R and amplifies a reception signal in communication band A; power amplifier 12 that amplifies a transmission signal in communication band B that is different from communication band A; low-noise amplifier 22 that amplifies a reception signal in communication band B; switch 53A that switches a connection of antenna connection terminal 100 between power amplifier 12 and low-noise amplifier 22; and module substrate 91 including principal surface 91a and principal surface 91b on opposite sides of module substrate 91. In such radio frequency module 1, power amplifiers 11 and 12 are disposed on principal surface 91a, low-noise amplifiers 21 and 22 are incorporated in semiconductor IC 20 disposed on principal surface 91b, and in a plan view of module substrate 91, the distance between power amplifier 11 and semiconductor IC 20 is greater than the distance between power amplifier 12 and semiconductor IC 20.

As described above, radio frequency module 1A according to the present variation includes: transmission filter 62T having a passband that includes the transmission band in communication band B and reception filter 62R having a passband that includes the reception band in communication band B. In such radio frequency module 1A, power amplifier 12 is connected to switch 53A via transmission filter 62T, low-noise amplifier 22 is connected to switch 53A via reception filter 62R, and the first conductive component includes at least one of transmission filter 62T or reception filter 62R.

This structure improves the isolation characteristics between the transmission circuit and the reception circuit as with the above embodiment. This structure further enables at least one of transmission filter 62T or reception filter 62R to be used as the first conductive component in the case where different filters (transmission filter 62T and reception filter 62R) are used for a transmission signal and a reception signal of TDD in communication band B. This structure thus reduces the number of components of radio frequency module 1A compared to the case where a dedicated component is used as the first conductive component.

Variation 2

The following describes Variation 2. The present variation is different from the embodiment mainly in that bump electrodes 150B are used, instead of post electrodes 150, as external-connection terminals. With reference to FIG. 6, the following description focuses on the difference from the embodiment to describe radio frequency module 1B according to the present variation.

FIG. 6 is a cross-sectional view of radio frequency module 1B according to Variation 2. As shown in FIG. 6, radio frequency module 1B according to the present variation includes a plurality of bump electrodes 150B instead of a plurality of post electrodes 150.

A plurality of bump electrodes 150B Is an example of the external-connection terminals. Each of bump electrodes 150B is disposed on principal surface 91b of module substrate 91. Bump electrodes 150B are connected to an input and output terminal and/or a ground electrode, and so forth on the mother board that is disposed in the negative direction of the Z axis of radio frequency module 1B.

In the present variation, the circuit components on principal surface 91b of radio frequency module 1B are not covered with a resin member.

As described above, radio frequency module 1B according to the present variation includes bump electrodes 150B as its external-connection terminals, instead of post electrode 150. The radio frequency module with such structure also achieves the same effects as those achieved by the above-described embodiment.

Another Variation

The radio frequency module and the communication device according to the present disclosure have been described above, using the embodiment and variations thereof, but the radio frequency module and the communication device according to the present disclosure are not limited to such embodiment and variations thereof. The present disclosure also includes: another embodiment achieved by freely combining structural elements in the embodiment and variations thereof; variations achieved by making various modifications to the embodiment and variations thereof that can be conceived by those skilled in the art without departing from the essence of the present disclosure; and various devices that incorporate the radio frequency module and the communication device described above.

For example, in the radio frequency module and the communication device according to each of the embodiment and variations thereof, another circuit element, wiring, and so forth may be present in a path that connects each circuit element and a signal path disclosed in the drawings. In the above embodiment, for example, an Impedance matching circuit may be connected between duplexer 61 and switch 53, and/or between filter 62 and switch 53.

Note that the shape and disposition of each component, as well as the shape, number, and disposition of each electrode in the embodiment and variations thereof are mere examples, and thus the present disclosure is not limited to these examples. For example, at least one of power amplifiers 11 and 12, switch 51, duplexer 61, or filter 62 may be disposed on principal surface 91b, and at least one of low-noise amplifiers 21 and 22, or switch 53 may be disposed on principal surface 91a. Also, the positions of duplexer 61, filter 62, and switch 51 may be interchanged. Also, the positional relationships between the conductive components and power amplifiers 11, 12, and semiconductor IC 20 are not limited to the above-described examples. For example, no conductive component may be disposed between power amplifiers 11 and 12.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure is widely applicable for use in a communication device (e.g., mobile phone) as a radio frequency module that is placed at the front-end portion.

The invention claimed is:

1. A radio frequency module, comprising:
a substrate including a first principal surface and a second principal surface on opposite sides of the substrate;
a duplexer including a first filter having a passband that includes a transmission band in a first communication band and a second filter having a passband that includes a reception band in the first communication band;
a first power amplifier disposed on the first principal surface and connected to the first filter and configured to amplify a transmission signal in the first communication band;
a first low-noise amplifier connected to the second filter and configured to amplify a reception signal in the first communication band;
a second power amplifier disposed on the first principal surface and configured to amplify a transmission signal in a second communication band that is different from the first communication band;
a second low-noise amplifier configured to amplify a reception signal in the second communication band; and
a switch configured to switch a connection of an antenna connection terminal between the second power amplifier and the second low-noise amplifier, wherein
the first low-noise amplifier and the second low-noise amplifier are incorporated in a semiconductor integrated circuit that is disposed on the second principal surface, and
in a plan view of the substrate, a distance between the first power amplifier and the semiconductor integrated circuit is greater than a distance between the second power amplifier and the semiconductor integrated circuit.

2. The radio frequency module of claim 1, further comprising:
a conductive component disposed on the first principal surface, between the first power amplifier and the second power amplifier in the plan view of the substrate.

3. The radio frequency module of claim 2, further comprising:
a third filter having a passband that includes the second communication band.

4. The radio frequency module of claim 3, wherein
the switch is connected to the antenna connection terminal via the third filter.

5. The radio frequency module of claim 4, wherein
the conductive component includes the third filter.

6. The radio frequency module of claim 2, further comprising:
a third filter having a passband that includes a transmission band in the second communication band; and
a fourth filter having a passband that includes a reception band in the second communication band.

7. The radio frequency module of claim 6, wherein
the second power amplifier is connected to the switch via the third filter, and
the second low-noise amplifier is connected to the switch via the fourth filter.

8. The radio frequency module of claim 7, wherein
the first conducive component includes at least one of the third filter or the fourth filter.

9. The radio frequency module of claim 1, further comprising:
a conductive component disposed on the first principal surface, between the first power amplifier and the semiconductor integrated circuit in the plan view of the substrate.

10. The radio frequency module of claim 9, wherein
the conductive component includes the duplexer.

11. The radio frequency module of claim 1, further comprising:
a conductive component disposed on the first principal surface or the second principal surface, between the second power amplifier and the semiconductor integrated circuit in the plan view of the substrate.

12. The radio frequency module of claim 11, wherein
the conductive component includes the switch.

13. The radio frequency module of claim 1, further comprising:

external-connection terminals disposed on the second principal surface.

14. The radio frequency module of claim 1, wherein the first communication band is a communication band to which frequency division duplex is applied as a duplex mode.

15. The radio frequency module of claim 14, wherein the second communication band is a communication band to which time division duplex is applied as a duplex mode.

16. A communication device, comprising:
a signal processing circuit configured to process a radio frequency signal that is to be transmitted or has been received by an antenna; and
a radio frequency module configured to transfer the radio frequency signal between the antenna and the signal processing circuit, wherein
the radio frequency module comprises:
a substrate including a first principal surface and a second principal surface on opposite sides of the substrate;
a duplexer including a first filter having a passband that includes a transmission band in a first communication band and a second filter having a passband that includes a reception band in the first communication band;
a first power amplifier disposed on the first principal surface and connected to the first filter and configured to amplify a transmission signal in the first communication band;
a first low-noise amplifier connected to the second filter and configured to amplify a reception signal in the first communication band;
a second power amplifier disposed on the first principal surface and configured to amplify a transmission signal in a second communication band that is different from the first communication band;
a second low-noise amplifier configured to amplify a reception signal in the second communication band; and
a switch configured to switch a connection of an antenna connection terminal between the second power amplifier and the second low-noise amplifier, wherein
the first low-noise amplifier and the second low-noise amplifier are incorporated in a semiconductor integrated circuit that is disposed on the second principal surface, and
in a plan view of the substrate, a distance between the first power amplifier and the semiconductor integrated circuit is greater than a distance between the second power amplifier and the semiconductor integrated circuit.

17. A radio frequency module, comprising:
a substrate including a first principal surface and a second principal surface on opposite sides of the substrate;
a first filter having a passband that includes a transmission band in a first communication band;
a second filter having a passband that includes a reception band in the first communication band;
a first power amplifier disposed on the first principal surface and connected to the first filter and configured to amplify a transmission signal in the first communication band;
a first low-noise amplifier disposed on the second principal surface and connected to the second filter and configured to amplify a reception signal in the first communication band;
a second power amplifier disposed on the first principal surface and configured to amplify a transmission signal in a second communication band that is different from the first communication band; and
a second low-noise amplifier disposed on the second principal surface and configured to amplify a reception signal in the second communication band, wherein
the first low-noise amplifier and the second low-noise amplifier are incorporated in an integrated circuit disposed on the second principal surface, and
in a plan view of the substrate, a distance between the first power amplifier and the integrated circuit is greater than a distance between the second power amplifier and the integrated circuit.

18. The radio frequency module of claim 17, further comprising:
a conductive component disposed on the first principal surface, between the first power amplifier and the second power amplifier in the plan view of the substrate.

19. The radio frequency module of claim 18, further comprising:
a third filter having a passband that includes the second communication band; and
a switch connected to an antenna connection terminal via the third filter, wherein
the conductive component includes the third filter.

* * * * *